United States Patent
Gold et al.

(10) Patent No.: US 11,618,227 B2
(45) Date of Patent: Apr. 4, 2023

(54) METHOD FOR MANUFACTURING AN ELECTRONIC OR ELECTRICAL SYSTEM

(71) Applicant: FRIEDRICH-ALEXANDER-UNIVERSITÄT ERLANGEN-NÜRNBERG, Erlangen (DE)

(72) Inventors: Gerald Gold, Erlangen (DE); Klaus Helmreich, Altdorf (DE); Johannes Hörber, Großhabersdorf (DE); Konstantin Lomakin, Nuremberg (DE); Mark Sippel, Fürth (DE)

(73) Assignee: FRIEDRICH-ALEXANDER-UNIVERSITÄT ERLANGEN-NÜRNBERG, Erlangen (DE)

( * ) Notice: Subject to any disclaimer, the term of this patent is extended or adjusted under 35 U.S.C. 154(b) by 324 days.

(21) Appl. No.: 16/480,467

(22) PCT Filed: Jan. 16, 2018

(86) PCT No.: PCT/EP2018/051009
§ 371 (c)(1),
(2) Date: Aug. 9, 2019

(87) PCT Pub. No.: WO2018/137972
PCT Pub. Date: Aug. 2, 2018

(65) Prior Publication Data
US 2020/0031068 A1 Jan. 30, 2020

(30) Foreign Application Priority Data
Jan. 27, 2017 (DE) ............ 10 2017 000 744.6

(51) Int. Cl.
*B29C 70/88* (2006.01)
*H05K 1/02* (2006.01)
(Continued)

(52) U.S. Cl.
CPC .......... *B29C 70/882* (2013.01); *B29C 64/112* (2017.08); *H05K 1/0284* (2013.01);
(Continued)

(58) Field of Classification Search
None
See application file for complete search history.

(56) References Cited

U.S. PATENT DOCUMENTS

2004/0196112 A1 10/2004 Welbon et al.
2007/0128855 A1 6/2007 Cho et al.
(Continued)

FOREIGN PATENT DOCUMENTS

DE 102014201121 A1 7/2015
DE 202015103801 U1 8/2015
(Continued)

OTHER PUBLICATIONS

German Patent Application No. 102017000744.6, Search Report, dated Oct. 5, 2017.
(Continued)

*Primary Examiner* — Edmund H Lee
(74) *Attorney, Agent, or Firm* — Marshall, Gerstein & Borun LLP (57) ABSTRACT

The present invention relates to a method for manufacturing an electronic or electrical system, the method comprising the layer-free production of at least one physical structure (101, 102) which is designed to guide electromagnetic waves, using at least one additively operating apparatus, wherein the layer-free production of the spatial, layer-free structure comprises the simultaneous or sequential application and/or removal of one or more materials in the spatial arrangement, as a result of which the electronic or electrical system is (Continued)

partially or completely formed. The invention further relates to a system which is manufactured in accordance with the method.

25 Claims, 3 Drawing Sheets

(51) Int. Cl.
*H05K 1/14* (2006.01)
*H05K 3/46* (2006.01)
*B29C 64/112* (2017.01)
*H05K 3/12* (2006.01)

(52) U.S. Cl.
CPC .......... *H05K 1/145* (2013.01); *H05K 3/1241* (2013.01); *H05K 3/4685* (2013.01)

(56) References Cited

U.S. PATENT DOCUMENTS

| | | |
|---|---|---|
| 2007/0141743 A1 | 6/2007 | Mathieu et al. |
| 2008/0143358 A1 | 6/2008 | Breinlinger |
| 2009/0321123 A1 | 12/2009 | Lochtman et al. |
| 2011/0051966 A1 | 3/2011 | De Finis et al. |
| 2014/0036455 A1 | 2/2014 | Napadensky |
| 2014/0209372 A1 | 7/2014 | Sobe |
| 2014/0231266 A1 | 8/2014 | Sherrer et al. |
| 2015/0201500 A1* | 7/2015 | Shinar .................. B29C 64/135 425/132 |
| 2015/0295300 A1 | 10/2015 | Herbsommer et al. |
| 2016/0039145 A1 | 2/2016 | Steiner |
| 2016/0198576 A1 | 7/2016 | Lewis et al. |

FOREIGN PATENT DOCUMENTS

| | | |
|---|---|---|
| DE | 102014007562 A1 | 11/2015 |
| WO | WO-2013/103600 A1 | 7/2013 |

OTHER PUBLICATIONS

International Application No. PCT/EP2018/051009, International Search Report, dated May 4, 2018.

* cited by examiner

METHOD FOR MANUFACTURING AN ELECTRONIC OR ELECTRICAL SYSTEM

The present invention relates to a method of manufacturing an electronic or electrical system.

It is known from the prior art to manufacture printed circuit boards photochemically. In this respect, a planar board comprising a dielectric substrate that is coated with copper films at one side or at both sides so that electrically conductive and electrically non-conductive layers arise is processed in a photolithographic process. A thin film of a light sensitive photoresist is applied to the surface of the metallized board. The exposure of the photoresist subsequently takes place through a mask having the desired layout of the traces of the board. Depending on the type of photoresist, either the exposed or the non-exposed regions of the photoresist are soluble in a liquid and are removed by means of this liquid so that regions of the copper film are present that are coated by the photoresist and furthermore such regions are present for which this is not the case.

The board pretreated in this manner is then introduced into an etching solution. In this process, the regions not coated by the photoresist are removed, but not the regions covered by the photoresist because the photoresist is resistant to the etching solution. A line pattern corresponding to the mask is obtained in this manner.

Printed circuit boards having more than two conductive boards or layers are produced by layer-wise adhesive bonding of the boards produced in this manner to interposed dielectric films. The electrical connection of these layers takes place by so-called vias, with them being bores through the boards whose inner walls are metalized in further process steps to manufacture a conductive connection.

Methods known from the prior art for the manufacture of printed circuit boards are furthermore the pressing technology and the wire wrapping technology as well as screen printing technology.

As a consequence of the increasing surface density of component connections, the number of layers for the electrical connection has to be increased to observe production-related design rules for width and spacing. Alternatively, blind vias or buried vias have to be used. Blind vias are blind holes that connect an outer layer to an inner layer; a buried via is a via between two inner layers that is not visible from the outer layers. Both blind vias and buried vias represent vias that always form interference points in the signal path. The background to this is that the technical radio frequency properties also depend on the geometrical shape of the structure or of the line cross-section in addition to on the respective material properties.

The high number of electrical connections required due to the increasing density of component connectors has the result that not all the component connectors or not all the electrical connections can be connected on a direct path in one and the same layer, but rather that layer changes become necessary, i.e. the electrical connections undergo one or more layer changes.

Figure 5:
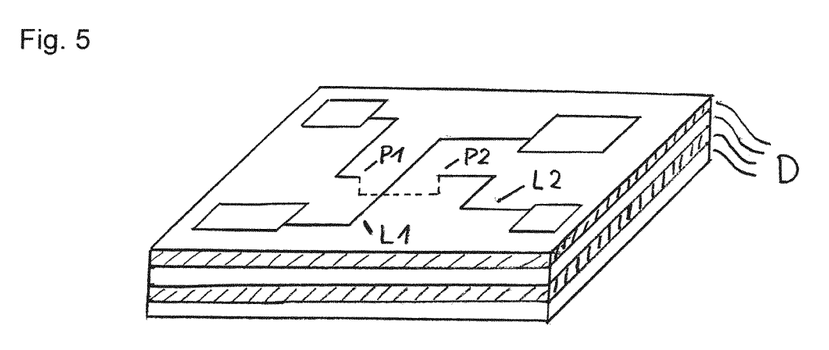
FIG. 5: a schematic perspective view of a printed circuit board in accordance with the prior art.

FIG. 5 shows such a design of a printed circuit board known from the prior art. Reference numerals D mark the dielectric zones that are each provided with traces at both sides that have, for example, been obtained by the above-mentioned photolithographic process. Two traces L1 and L2 are shown by way of example, with trace L1 only running in a first layer and trace L2 carrying out a layer change a points P1 and P2 from the first layer in the second layer below it, or vice versa, and with the section located between the points P1 and P2 extending in the second layer.

The transition from the printed circuit board with its planar layer structures to three-dimensional components or connectors to the application environment mounted thereon is furthermore disadvantageous. This is implemented in the prior art by bonded or soldered connections. This procedure can no longer be implemented satisfactorily for signals having currently already used frequencies. Apart from this, it cannot be ensured by the initially named technical etching production process that the small structural widths required for high frequencies are achieved.

The printed circuit board manufactured in accordance with the prior art can only be tested with respect to its specified properties after the last processing step before mounting. The functional test of the total circuit is only possible after the mounting. Bond wires are used for the contacting of ICs without housings, but represent a parasitic inductance and thus an interference point. Crosstalk between two or more transmission channels typically takes place at the component boundaries since the connector structures are here particularly close to one another. In addition, the connector geometries and the occupancy pattern are predefined and can only be optimized by the developer with restrictions with respect to crosstalk.

The printed circuit board production in accordance with the prior art requires a large number of individual process steps from the structured substrate to the mounted interconnect device. In this process, every machine change (pressing of the layers, drilling of the via, electroplating, mounting, etc.) is associated with a new registration of the workpiece and thus with certain position imprecisions. A further disadvantage of known printed circuit boards is finally that the high power density is associated with a correspondingly high heating. To dissipate the heat, additional structures such as thermal vias or copper disks have to be introduced into the printed circuit board. This can result in cracks and/or to a delamination of the layers of the printed circuit board with unfavorable material combinations and with the different coefficients of thermal expansion associated therewith.

It is the underlying object of the present invention to provide a method by means of which electronic systems having a number of interference points reduced with respect to known systems can be manufactured in a comparatively simply and flexible manner. It is preferably the underlying object of the present invention to provide a method by which a system suitable for radio frequency technology or a circuit arrangement suitable for radio frequency technology can be provided.

This object is achieved by a method in accordance with claim 1. Advantageous embodiments are the subject of the dependent claims.

Provision is accordingly made that the method comprises the layer-free production of a at least one layer-free spatial structure that is able to conduct one or more electromagnetic waves. The method takes place using at least one additive method or using at least one apparatus working in accordance with an additive method, wherein the layer-free production of the layer-free spatial structure comprises the simultaneous or sequential application and/or removal of one or more materials in a spatial arrangement, whereby the electronic or electrical system is partially or completely manufactured.

The structure or system manufactured in accordance with the invention is configured or adapted such that electromagnetic waves can preferably be guided on specific paths by means of the structure or system. The invention thus does not relate to structures or systems that are only designed to conduct an electric current, but rather to structures or systems by means of which electromagnetic waves can be conducted exclusively or at least also, preferably in a targeted manner, which does not preclude that charge carriers are additionally conducted, i.e. that a current flow is e.g. possible.

A preferred area of application of the present invention is radio frequency technology and/or systems for data rates.

The material or materials can, for example, be electrically conductive and/or electrically non-conductive materials and/or materials having particular magnetic and/or electrical properties.

The manufacture of the structure preferably takes place in any desired spatial arrangement.

The electronic or electrical system can comprise or consist of an interconnect device.

The term "layer-free" and the term "in a spatial arrangement" is to be understood such that the spatial structure is not necessarily manufactured layer by layer, i.e. two-dimensionally, even though this would be possible, but rather in a layer independent manner. In other words, it is not the case that first one layer is manufactured, then the next, etc. that are connected to one another, but the setup of a spatial, i.e. three-dimensional structure rather takes place.

It is possible by the method in accordance with the invention to manufacture function-orientated conductive or non-conductive spatial structures having largely any desired cross-sectional geometries, in particular cross-sectional geometries optimized with respect to the performance of the production device, optionally on a carrier formed and designed in any desired manner for electrical and/or electronic circuits, before, during, or after the application of components by a simultaneous or sequential application and/or removal of conductive or non-conductive materials and/or other materials in any desired spatial arrangement. Instead of a strictly layer-wise procedure, material is set up at least regionally three-dimensionally in accordance with the invention and not only in one surface, i.e. two-dimensionally.

If a carrier is used as the substrate, it can be configured as disposed in a plane or as three-dimensional.

The additive process or processes can be a printing process or a 3D printing process, in particular an ink jet process, a plasma dust process, an aerosol jet process, or an extrusion process, or a laser melting process. Any other desired additive processes such as fused deposition molding (FDM) are also covered by the invention. A plurality of different additive processes can also be used to manufacture a system. Reference is made with respect to the aerosol jet method to U.S. Pat. No. 8,640,975 that describes a similar process or a miniature aerosol jet process that can likewise be used within the framework of the present invention.

In a preferred embodiment of the invention, one or more lines and/or conductor tracks of correct characteristic impedance and/or preferably passive elements, in particular filters and/or couplers and/or antennas and/or dielectric and/or electrically conductive regions are built up. These regions can be built up in a changing or different kind of sequence.

The method can furthermore comprise the provision or production of at least one carrier and the layer-free generation of the at least one spatial structure on the carrier. It is thus conceivable, for example, that lines, tracks of correct characteristic impedance and preferably passive elements are built up on a carrier formed and designed in any desired manner by a suitable sequence of dielectric and conductive regions. They can, for example, be filters, couplers, antennas, etc.

The carrier can, for example, also be an interconnect device such as is known from the prior art, for example in accordance with FIG. 5.

The carrier can consist of plastic, metal (e.g. aluminum), or ceramics or can be composed of these materials. It can already be mounted or also not mounted with elements and/or traces.

It is pointed out at this point that the term "conductive" means "electrically conductive" if not otherwise stated.

It is further pointed out that the terms "a" and "one" do not necessarily refer to exactly one of the elements in question, even though this is covered by the invention, but can also cover a plurality of the elements in question. It must equally be pointed out that the use of the plural of an element also includes the presence of exactly one element and conversely the use of the singular with respect to the element also comprises a plurality of said elements.

The carrier can be designed as electrically non-conductive, electrically conductive, or a hybrid with respect to the electrical conductivity, i.e. as regionally conductive and regionally non-conductive. It can, for example, consist of or comprise an interconnect device such as a printed circuit board or an MID (molded interconnect device).

The carrier can likewise be manufactured in accordance with the method in accordance with the invention or in accordance with another method.

The carrier can have or provide one or more electrical and/or mechanical and/or thermal functionalities. The heating of the circuit to be set up and/or the heat dissipation therefrom can be ensured by suitable materials or structures.

The carrier can exert only one mechanical function in that it forms the substrate, i.e. the basis for the system. It can alternatively or additionally include electrical functional structures such as antennas, connectors, resonators, ground planes, etc. It can also serve the reception of components such as ICs that are placed on the carrier or in cavities of the carrier before the manufacture of the connection structures such as lines, etc.

In a particularly preferred embodiment of the invention, at least one line, in particular a signal line, is manufactured that maintains the cross-section, i.e. has a correct characteristic impedance, in that an electrically conductive region is first manufactured, in that a dielectric region is applied thereto on which in turn one or more tracks are generated, in that a further dielectric region is applied such that the track or tracks are surrounded by a dielectric jacket, and subsequently a further jacket is applied that is at least partially metalized or that is conductive in a different manner and/or that consists of a dielectric. The aerosol jet process is preferably used to manufacture such lines. However, other additive processes can also be considered by which dielectric and conductive regions can be produced.

The signal line can have an inner line and an outer line. The signal line can have the above-named structure or also a structure deviating therefrom.

It is also conceivable that a line that maintains the cross-section, i.e. has a correct characteristic impedance, in particular a signal line, is manufactured, that a dielectric region is manufactured in which no track or at least one track is located, and that a jacket is applied that surrounds the dielectric region, and that is at least partially metallized, and/or consists of a dielectric, with the aforesaid steps being carried out in part or also simultaneously or after one another.

The manufacture of the lines can generally take place sequentially (one material after another is applied) by forming disk-like regions set next to one another, or also simultaneously in that the different materials are applied at the same time.

Any desired elements such as plugs, sockets, holders, etc. can be manufactured using the method in accordance with the invention. Couplers, antennas such as helical antennas, horn antennas, etc. can also be manufactured using the method in accordance with the invention.

Provision is preferably made that the dielectric jacket is applied in a width that corresponds to the total width of the line and/or that the dielectric jacket is applied such that its spacing from the electrically conductive region reduces toward the margins of the line cross-section of the line. This is made possible by the selective application of the dielectric.

It is furthermore of advantage if the at least partially metalized jacket is connected to the electrically conductive region so that a conductive jacket of the line or of the signal line is formed that is completely closed in the cross-sectional view.

All the line cross-section types can be produced by the method described in an equivalent manner to the customary forms such as a strip line, a coplanar line, a differential line, etc.

It is conceivable that, depending on the properties of the carrier or of the structures below it, a dielectric film is present as the support of the line to achieve better adhesion or to compensate irregularities.

The line preferably has a length-homogeneous line cross-section, i.e. it does not change cross-section over the length. Differing from this, the line or its jacket can be pierced at specific points at the upper side or lower side to e.g. achieve an electrical coupling to the carrier, to other lines, or components and to form branching points.

It is furthermore possible that the spacings of the tracks in the interior of the line are selected with respect to one another per se or together with the spacing from the outer metalization of the jacket such that those spacing that can be established with the smallest tolerances by the process used are just those that influence the line wave impedance the most.

It is possible in accordance with the invention to produce a flat (height<width) line or signal line.

Such a flat construction in particular (but not exclusively) allows crossovers without additional support structures. Such a crossover is also covered by the invention. In this respect, the cross-section geometry of the lines preferably remains unchanged, i.e. does not adopt any change even in the crossing region. No interference points are thus produced, i.e. no reflection in the signal path. While in accordance with the prior art a layer change of the line and vias having cross-sections differing from the line in the region of the crossing of the lines is necessary due to the layer-wise arrangement—as can be seen from FIG. 5—these demands area dropped in accordance with the invention since work is no longer performed in a strictly layer-wise manner. It is, for example conceivable first to produce a first conductor and subsequently to produce a second conductor that crosses over the first conductor, which requires work being carried out three-dimensionally since the second conductor has to be placed over the first conductor in the crossing region. This is possible with low crosstalk in the advantageous embodiment of the conductors.

The lines can generally extend as desired, in parallel, cross-wise at any desired angles, in different planes, in different spatial directions, etc., without influencing one another.

Due to the flexibility of the process, any desired line components can be connected to contact points of the components selected as desired.

The structure in accordance with the invention preferably has no vias or bores at all since their presence is not absolutely necessary. Interference points can thus be prevented.

Material can be additionally applied to overcome larger height differences. Hollow spaces can be completely filled with material in this respect. It is also conceivable that a negative form, i.e. a hollow region, is formed in the material that is then filled with a different material. This filling preferably takes place using a conductive material. A conductor can be formed in this manner that has a larger cross-section in relation to the line or to the signal line so that this conductor having greater ampacity can be used, for example, for a current supply or for a power supply.

Instead of or in addition to the conductive material, thermally conductive or heat transporting solid, liquid, or gaseous materials can also be introduced into the hollow space so that a heat dissipation from the system is possible. Heat can thus, for example, be exchanged between the manufactured system and a heatsink or a carrier.

Both the electrical lines and the cooling structures can here be guided not only horizontally or vertically, but also in any desired spatial directions. This applies accordingly to the manufactured lines or signal lines.

Provision is preferably made that within the framework of the mechanical and/or electrical integration of components, the process does not have any additional process step such as soldering or bonding except for the additive process.

It is possible that gaps or vertical differences have to be overcome for the electrical contacting over component boundaries. Gaps can e.g. be filled with a dielectric material and vertical differences can e.g. be compensated by means of the dielectric material, for example in the form of ramps or other elevated portions. One or more lines such as signal lines, etc. can then be produced on the dielectric material applied in this manner.

The lines, in particular signal lines, are preferably geodetically produced, i.e. on the shortest path between two connector points.

It is conceivable in a further embodiment that the mechanical integration of components of any kind takes place by a fastening to a carrier, by embedding into the dielectric material before its hardening, by printing over components, or by covering lines, in particular signal lines.

Provision can furthermore be made that the electrical connection of a line, in particular of a signal line, to a component takes place by the contacting of the metallic jacket of the line with the housing of the component or with a ground of the component and that the contacting of the signal conductor takes place at the signal connector. Every line or every signal line can in this manner be guided with the correct wave impedance up to the respective component borders. Impedance-adapted transitions can thus be generated at the component boundary by the additive processes in accordance with the invention on the components. The conductive jacket of the line can here be used to screen connector pins from one another so that crosstalk becomes minimal even at component connectors.

Any desired electrical and electronic elements such as lines or components can be manufactured by the present method. Passive elements and/or waveguides, in particular hollow waveguides and dielectric waveguides, such as optical waveguides can thus be manufactured in accordance with the method. With a dielectric waveguide, only a dielectric having a relative permittivity that differs from that of the surrounding dielectric is to be used at corresponding points. They can also be screened from one another by application of a metal film.

Provision can furthermore be made that a location-dependent conductivity and/or material property of the carrier and/or of the system is established by the additive process and/or by a selective sintering process. A location-dependent, i.e. a location-variable, conductivity or a different material property can thus be produced at different points. Gradual transitions of conductivity are thus achieved. They can then be used as circuit elements that cannot be implemented with conventional techniques, for example to provide low-reflection terminal resistors. Innovative couplers can equally be set up therewith in that regions of different conductivity are used as a location-independent coupling.

The case is covered by the invention that the manufacture of the system is carried out with exactly one additive process. However, the use of a plurality of different additive processes is also conceivable that optionally produce different application thicknesses of the applied material. It is thus conceivable, for example, to use e.g. the aerosol jet process for fine structures such as conductors. Processes having a thicker application such as fused deposition molding (FDM) can be used as support. This process can, for example, be used to manufacture the carrier, to change the carrier geometry, to increase the total height of the system, to set up support structures, or to integrate different functional structures.

The use of different machining tools is also conceivable and covered by the invention. Examples are lasering or milling to ablatively produce functional structures. Ablative processes can furthermore be used to separate or remove already manufactured elements such as signal lines or already contacted components from the total circuit, i.e. from the system, again, e.g. to enable a functional test or if the functional test was not passed.

The method in accordance with the invention preferably manages with substantially fewer production steps than is known in accordance with the prior art. Dielectric and conductive regions are preferably additively produced and components are mounted and connected in exactly one production machine. A machine change and the additional tolerances of the registration associated therewith are dispensed with. Apart from this, the manufacturing costs such as material costs, setup costs, logistic costs, machine costs, and storage costs inherent in the photolithographic process are reduced. The machine costs of the method in accordance with the invention are considerably below those of conventional printed circuit board production.

The method in accordance with the invention saves resources since material is only applied where it is required for the later function of the system. Unlike the currently used processes of photolithographic production, there are no electroplating costs and no material waste in the form of excess copper areas arises.

The comparatively substantially smaller throughput of the individual machine is compensated or overcompensated in that a machine changes, i.e. transportation time, buffering time, and setup time, are saved. In addition, the throughput can be scaled by parallelization of machines of the same kind, which not only produces the advantage of not having any bottlenecks in the material flow, but also means that machines and products in prototype production and mass production are identical. The costs for prototypes thereby fall and substantial development time, production transfer time, and test time, and thus product introduction times, are reduced. A further unique advantage is the increase in the production volume, that is almost freely designable with respect to time and to quantity, on the market launch of a new product and the minimization of the otherwise huge economic risk associated therewith in this phase.

It is advantageous if the method is carried out at least partially sequentially and if at least one functional test takes place at at least one element of the electronic system during the method.

The completely or at least partially sequential setup of the connection structures enables a functional test of every manufactured or placed circuit element or component at every point in time of the manufacturing process. If a possibility is provided to measure the actual electrical values such as line characteristic impedance or filter flank position during production, setting values for the production plant can be calculated therefrom, whereby a regulation of functionally decisive parameters and thus a completely new quality level can be implemented. In a similar manner, setting values can be provided by production-parallel simulation. At the same time, the total costs fall since the subsequent quality assurance of the interconnect devices thus produced is omitted. If a functional test of a signal line or of a component fails during production, a new signal line can additionally be produced as a replacement without the total circuit or the total interconnect device having to be removed and discarded. Components or ICs tested as defective can equally remain in the interconnect device and can be printed over. If additional machining possibilities such as a milling head or a laser are provided, existing connections can be disconnected and new replacement structures added.

All these measures are possible during the production process of the system or of the interconnect device and not after the end of production, which is associated with the aforesaid advantages and enables an early intervention.

The selective removal, addition, or replacement of components or lines and the ablative or additive modification of functional structures can take place before, during, or after the functional test, in particular after the determination of a malfunction.

Provision is preferably made that the connection of a line to a component takes place with the same steps or with the same manufacturing process as the manufacture of the line itself. In this respect, substantially fewer interference points occur in the signal path than in conventional technologies such as soldering or bonding which are here preferably not used at all. By the replacement of these separate manufacturing costs, their production times and costs are also dispensed with.

Interfering electrical crosstalk can be substantially reduced in that a conductive jacket is generated at the corresponding component connectors or contact areas. With conventional interconnect devices, crosstalk can only be influenced in the interconnect device itself, but not directly at component connectors.

The components, lines, etc. can be placed as desired geometrically and alignment can thereby also be made according to mechanical or thermal aspects. They can be completely embedded so that signal lines can be conducted above or below the components, whereby the integration density increases substantially. An additional process step for casting the components additionally becomes superfluous.

It is additionally possible with the manufacturing method in accordance with the invention to mount and to contact components before, during, or after the manufacturing process. This first enables critical circuit parts to be set up and to be tested and only to continue with the manufacturing process on passing the functional test of the part circuit. Specially with ICs, it is thus possible to make use of substantially less expensive, untested bare dies. They are provided with connector structures that are anyway needed for the later function of the circuit, are tested, and are only connected to other ICs or circuit parts on a successful test.

The cross-section of the signal line of the correct characteristic impedance can be adapted by the dielectric method in accordance with the invention such that the line characteristic impedance reacts as insensitively as possible to tolerances in the production process. The decisive advantage over multilayer circuit boards is furthermore that tracks do not have to be laid section-wise in signal layers between cross-signal reference potential layers. Each line can instead be laid with its respective own reference potential structure in as direct a way as possible without changing the cross-section and thus the line characteristic impedance in so doing.

The disentanglement of complex circuits is solved by crossovers of mutually insulated and screened signal lines instead of by a signal-impairing layer change between a plurality of layers. Since every signal line can be very flat and has a favorable shape due to the production process, a crossing of lines is possible without additional support structures or bridge structures. Low crosstalk of adjacent signal lines is inherent due to the screening jacket. Specified signal run times can be achieved by correspondingly long signal lines of this shape or by materials of different permittivity.

The system or interconnect device obtained by the method in accordance with the invention permits a signal path that is of low reflection overall to be implemented by connection lines and transitions to components that are simple to manufacture and that have correct characteristic impedance. The total damping is dependent on the conductor length, on the materials used, and on the manufacture-specific surface roughness, with the advantage of lower reflection for typical line lengths predominating.

Passive elements that cannot be implemented with conventional technology such as low-reflection connector resistors or couplers with location-dependent coupling factors can furthermore be produced by gradients of the material properties, e.g. of the conductivity.

The new topology requires a less complex design process since the information on the connectors to be connected is sufficient to manufacture the circuit. The necessity of finding a routing of the individual tracks made necessary by the conventional layer-oriented setup and impairing the signal integrity is dispensed with. It is thus possible to direct the design process more to other substantial aspects. They, for example, include the component placement, the cooling, EMV, etc., whereby optimized circuits of high integration density are made possible.

Furthermore, connector areas can be printed or greater elevated portions can be metalized that e.g. act as a contract structure to other interconnect devices or components.

It is pointed out here that the term "component" and "element" are used synonymously for the same elements.

The term "region" can relates to a film, i.e. to a two-dimensional structure, or also to a three-dimensional structure.

The present invention further relates to an electronic or electrical system that is manufactured in accordance with a method in accordance with one of the claims 1 to 25.

Advantageous properties of the system or of the structure are also the features of claims 1 to 25 to the extent that they relate to the system or to the structure.

The system or structure is, for example, an interconnect device; however, the invention is not restricted thereto.

As stated above, the structure or system manufactured in accordance with the invention is configured such that electromagnetic waves can preferably be guided on specific paths by means of the structure or system. The invention thus does not relate to structures or systems that are only designed to conduct an electric current, but rather to structures or systems by means of which electromagnetic waves can be conducted exclusively or at least also, preferably in a targeted manner, which does not preclude that charge carriers are additionally conducted, i.e. that a current flow is e.g. possible.

The structure in accordance with the invention or the system in accordance with the invention is preferably used in radio frequency technology.

It is advantageous if the system has at least one cross-section maintaining line, i.e. a line, in particular a signal line, of correct characteristic impedance, that has at least one electrically conductive region, at least one dielectric region arranged thereon in which one or more tracks are embedded, and at least one jacket that is at least partially metalized as has been stated in more detail above.

Provision is preferably made here that the sheath of the line is connected to the electrically conductive region so that a closed jacket is present.

The system can also have at least one cross-section maintaining line, i.e. a line, in particular a signal line, of the correct characteristic impedance, that has a dielectric region, no track or at least one track located therein, and at least one jacket that is at least partially metalized.

It is conceivable that a plurality of the lines run over one another so that one or more crossing regions arise, with a line cross-section constant in the longitudinal direction of the conductors also preferably being present in the crossing point, i.e. no cross-section changes result from the crossover. The system can have one or more components, such as antennas, connectors, or resonators that can be spatially wide-spread, that are electrically or mechanically integrated by the additive process.

Provision is made in a further embodiment that the system has at least one carrier, with provision preferably being made that the carrier has one or more electrical and/or mechanical and/or thermal functionalities, which is associated with the above-named advantages.

Specific functions, in particular implemented by location-dependent electrical properties, or conventional components or their connection with respect to electrical, mechanical, or thermal properties can be optimized or substituted (conductivity gradient, shaft end, location-dependent coupling factor, coupler, etc.) by utilizing the degrees of freedom created by the method in accordance with the invention and/or by the selective production of different material compositions or material densities with location-dependence. An optimized cooling or heating of components or functional structures (coins, heatsinks, heat pipes, insulation, etc.) can be achieved by the production or application of structures or components of any desired shape from materials of suitable thermal conductivity or thermal capacity.

As stated above, conductive structures of sufficient dimensions, in particular for high current carrying capability or dielectric structures of sufficient dimensions, can be produced, in particular to reduce the risk of flashovers.

Further details and advantages of the invention will be explained in more detail with reference to an embodiment shown in the drawing. There are shown.

Figure 1:
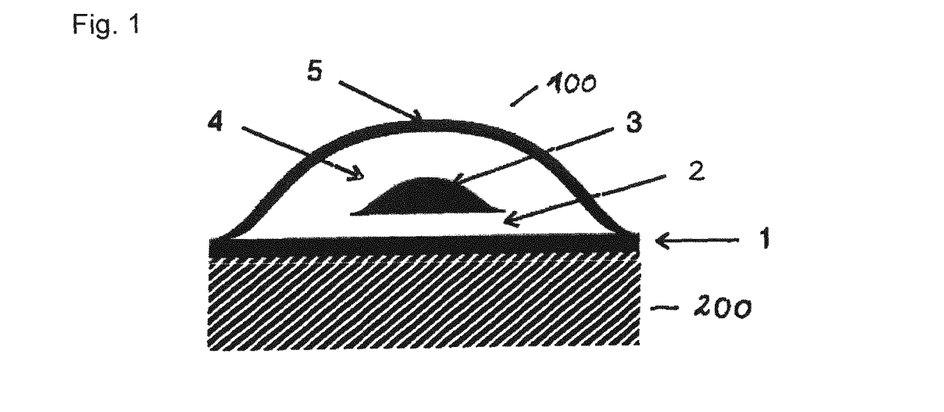
FIG. 1: a schematic cross-sectional view through a signal line manufactured in accordance with the invention.

FIG. 1 shows an electrically conductive film by the reference numeral 1 that corresponds to the width of the signal line 100 and forms its base surface. A dielectric layer 2 is applied to this film and, depending on the line type, no, or one or more tracks 3 can be produced on it. A further dielectric jacket 4, that together with the film 2 completely surrounds the track or tracks, follows over the total width of the signal line shown on a dashed carrier 200 in FIG. 1. The structure manufactured in this manner is provided with a jacket 5 that consists of metal overall or is metalized at least on one of its inner side or outer side and that is electrically conductively connected to the film 1. A completely peripheral conductive sheath, i.e. peripheral in the cross-sectional direction, is thus obtained. It can consist of metal or can be metalized or can consist of any other electrically conductive material or can be coated therewith.

The width of the dielectric decreases from top to bottom so that the signal line 100 has a flat bell shape in cross-section.

Figure 2:
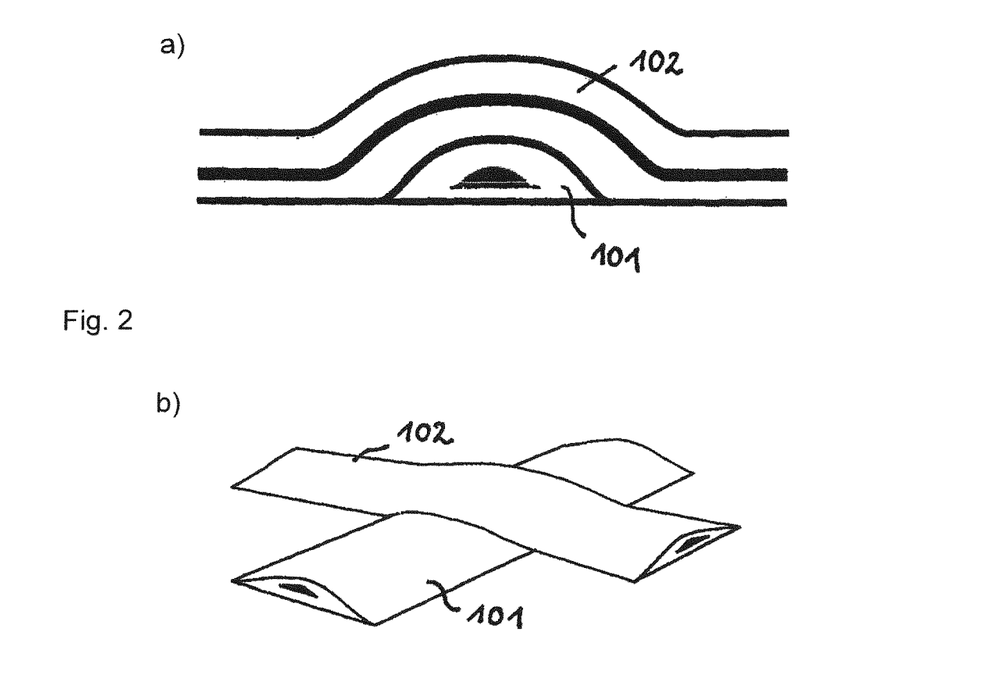
FIG. 2: a schematic sectional view through two crossed-over signal lines manufactured in accordance with the invention and their perspective view in the crossing region.

FIG. 2 shows two of these signal lines 100, 101 that run crossed as a sectional representation (FIG. 2a)) and as a perspective representation (FIG. 2b)). The flat construction shape of the signal lines 100, 101 makes this embodiment without support structures possible. The cross-sectional geometry of each signal line 100, 101 remains unchanged in the crossing region so that no interference points occur, i.e. no reflections in the signal path.

Figure 3:
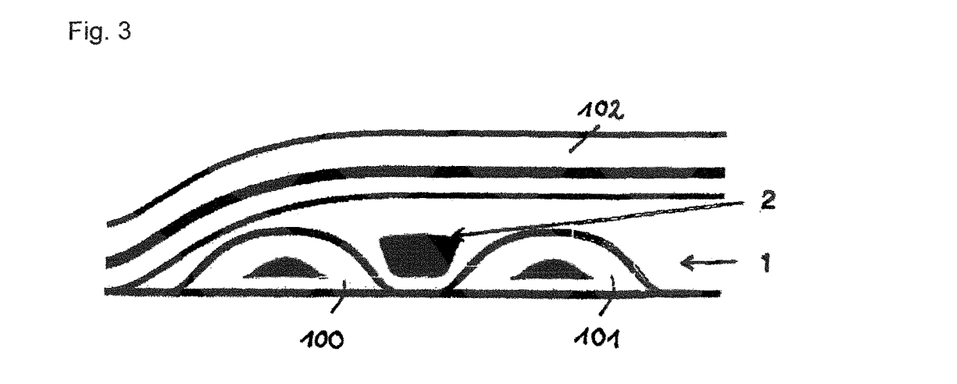
FIG. 3: a schematic sectional representation of crossed signal lines with additionally filled in intermediate spaces.

FIG. 3 shows an embodiment with three signal lines of which the signal line 102 at the top crosses the two signal lines 100, 101 at the bottom.

A conductor is marked by reference numeral 2 that extends in the direction of the covered signal lines 100, 101 and that has a greater cross-sectional area than the electrically conductive elements of the signal lines. This conductor 2 can thus be used as a line having a high ampacity for the power supply, etc.

Reference numeral 1 marks the dielectric material that fills the gaps below the top signal line 102.

Figure 4:
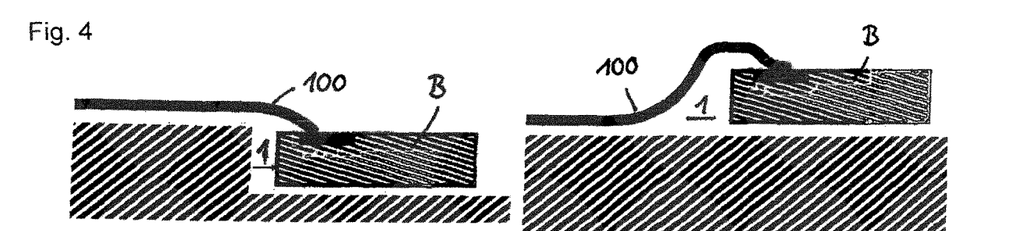
FIG. 4: schematic sectional views of integrated components with a dielectric to compensate the vertical differences and a perspective view of the connection of the line to element connectors.

The contacting beyond component boundaries can be seen from FIG. 4. A gap toward the component B has to be overcome in FIG. 4, left representation. It is filled by a dielectric material 1. A signal line 100 is produced on it. The component B is in an elevated position in FIG. 4, right representation, so that a ramp on which the signal line 100 is laid is produced by means of the dielectric material.

FIG. 4, lower representation, shows the connection of the line 100 manufactured in accordance with the invention to the component connectors, with the inner conductor 107 being conducted to a signal connector S and with the surrounding outer conductor 108 being conducted to a ground M and with simultaneously a screening toward other signals taking place.

The total setup (with or without carrier) in accordance with FIGS. 1 to 4 is implemented by an additive method in accordance with the invention.

The system manufactured in accordance with the present invention or the circuit arrangement is advantageously used in radio frequency technology.

Conceivable uses that do not, however, restrict the invention are:

interposers or space transformers are used to connect signal lines to one another over a short path for very high data rates of a plurality of ICs or connector structures of different distance patterns. Interposers without vias and bonding wires can be implemented using the method in accordance with the invention and the greatest interference points can thus be eliminated, which has the result of higher data rates.

Test adapters (device interfaces) that connect all the connectors of the components to be tested to the test device are required for the test of ICs. A plurality of signal lines for high data rates and/or high frequencies having the same signal run times have to be disentangled from a very small footprint of the IC for this purpose. This can be achieved using the described method with minimal crosstalk between the individual lines and the low-reflection signal paths, which has the result that components can be tested at their later application data rate or application frequency and very steep signal flanks can be applied to the test object.

A plurality of ICs are increasingly combined into packages to provide a specific function. Further components such as capacitors, resistors, etc. are usually additionally required. A high integration density can be achieved by the new method, with the components not only being able to be ideally placed in accordance with electrical aspects. In addition untested dies can be used, which substantially reduces the overall costs of the packages.

MIDs can be used as carriers so that e.g. a radar frontend can be set up on a carrier that contains antennas and serves mechanically as e.g. a housing or vehicle bumpers. ICs can be applied to this carrier and connection lines of the correct characteristic impedance are applied between ICs and antennas.

Finally, electronic systems that are installed in long-life products (control devices in motor vehicles, heating units, aircraft, etc.) can be subsequently produced in quantities tailored to requirements at any time, that is, also toward the end of the production life cycle, whereby storage costs for spare parts stocking are dispensed with (obsolescence avoidance).

Conventional interconnect devices of radio frequency technology in which a plurality of ICs are connected to signal lines of a predefined line characteristic impedance can be replaced with this setup technique and connection technique. Higher data rates can be achieved by the low-reflection connection.

Highly integrated radio modules comprising a transceiver and at least one antenna can be produced in that the transceiver and the antenna are connected to a predefined line characteristic impedance over the shortest path. The antennas can also be produced in that the jacket of the connection lines is expanded in a similar manner to a horn radiator so that an adaptation to the free space characteristic impedance takes place that is as good as possible.

For optical connection lines between optically operating components, waveguides can be produced by this setup technique and connection technique that have no cross-talk between one another by a metallic jacket of the individual waveguide.

The invention claimed is:

1. A method of manufacturing an electronic or electrical system, characterized in that the method comprises the layer-free production of at least one layer-free spatial structure that is configured to conduct electromagnetic waves using at least one additively working apparatus, wherein the layer-free production of the spatial layer-free structure comprises the simultaneous or sequential application and/or removal of one or more materials in a spatial arrangement, whereby the electronic or electrical system is partially or completely configured, wherein the spatial layer-free structure comprises one or more signal lines that are built up and have a flat bell shape in cross-section.

2. The method in accordance with claim 1, characterized in that the additively working apparatus works with a printing process.

3. The method in accordance with claim 1, characterized in that the method comprises the simultaneous or sequential application and/or removal of one or more magnetic and/or non-magnetic materials and/or electrically conductive and/or electrically non-conductive, or other materials and/or material mixtures;

and/or in that the electronic or electrical system comprises an interconnect device.

4. The method in accordance with claim 1, characterized in that the one or more signal lines comprises one or more signal lines of correct characteristic impedance and/or tracks and/or passive elements, wherein the one or more signal lines of correct characteristic impedance and/or tracks and/or passive elements are set up with provision being made that dielectric and electrically conductive regions are set up in a changing or other sequence.

5. The method in accordance with claim 1, characterized in that the method comprises the provision or production of at least one carrier and the layer-free production of the at least one spatial structure on the carrier.

6. The method in accordance with claim 5, characterized in that the carrier has one or more electrical and/or mechanical and/or thermal functions.

7. The method in accordance with claim 5, characterized in that the carrier is set up as electrically non-conductive, electrically conductive, or in a hybrid manner with respect to the electrical conductivity and/or comprises an interconnect device or an MID (molded interconnect device).

8. The method in accordance with claim 1, wherein the one or more signal lines comprises a cross-section maintaining line and manufacturing the cross-section maintaining line comprises:

first manufacturing or providing an electrically conductive region, applying a dielectric region to the electrically conductive region;

producing one or more tracks on the electrically conductive region, applying a further dielectric region so that the one or more tracks are surrounded by a dielectric jacket, and subsequently applying a further jacket that is at least partially metalized and/or consists of a dielectric.

9. The method in accordance with claim 8, characterized in that the dielectric jacket is applied in a width that corresponds to the total width of the cross-section maintaining line and/or that the dielectric jacket is applied such that its spacing from the electrically conductive region reduces toward the margins of the cross-section maintaining line.

10. The method in accordance with claim 8, characterized in that the at least partially metalized further jacket is connected to the electrically conductive region so that a conductive sheath is formed that is completely closed in a cross-sectional view.

11. The method in accordance with claim 1, wherein the one or more signal lines comprises a line that maintains the cross-section and manufacturing the line that maintains the cross-section comprises:

manufacturing a dielectric region in which no track or at least one track is located, and applying a jacket that surrounds the dielectric region, wherein the jacket is at least partially metallized, and/or consists of a dielectric, with the aforesaid steps being carried out in part or also simultaneously or after one another.

12. The method in accordance with claim 11, characterized in that the at least one track is connected to the jacket.

13. The method in accordance with claim 1, wherein the one or more signal lines comprises a plurality of signal lines and the plurality of signal lines are laid crossed so that one signal line is above the other signal line in the crossing region.

14. The method in accordance with claim 13, characterized in that a region below a signal line at the top of the plurality of signal lines is partially filled by a dielectric material; and/or in that a space is present in a region below the top signal line that is filled with an electrically conductive material and/or with a thermally conductive material.

15. The method in accordance with claim 1, characterized in that gaps are filled by a dielectric material; or in that ramps or other elevated portions are formed by means of the dielectric material to compensate vertical differences.

16. The method in accordance with claim 1, characterized in that the one or more signal lines are geodetically produced between two or more than two points.

17. The method in accordance with claim 1, characterized in that electrical integration of components of any kind only takes place by the additive process and not by an additional process step.

18. The method in accordance with claim 1, characterized in that the mechanical integration of components of any kind takes place by a fastening to a carrier, by embedding into a dielectric material before its hardening, by the overprinting of the components, or by covering with the one or more signal lines.

19. A method in accordance with claim 1, characterized in that electrical connection of a signal line of the one or more signal lines to a component takes place by contacting of a metallic jacket of the signal line to a housing of the component or to a ground of the component and of a track or tracks to one or more signal connectors of the component.

20. The method in accordance with claim 1, characterized in that passive elements and/or waveguides are manufactured.

21. The method in accordance with claim 1, characterized in that a location-dependent conductivity and/or material property are established by the additive process and/or by a sintering process.

22. The method in accordance with claim 1, characterized in that exactly one additive process is used; or in that a plurality of different additive processes are used that produce different application thicknesses of the applied material; and/or in that one or more ablative processes are used.

23. The method in accordance with claim 1, characterized in that the entire method takes place in exactly one production machine.

24. The method in accordance with claim 1, characterized in that the method is carried out at least partially sequentially; and in that at least one function test takes place at least one element of the electronic system during the method.

25. The method in accordance with claim 1, characterized in that connection of a signal line of the one or more signal lines to a component takes place by the same steps as the manufacture of the signal line itself.

\* \* \* \* \*